United States Patent
McNeil et al.

(10) Patent No.: US 8,056,415 B2
(45) Date of Patent: Nov. 15, 2011

(54) SEMICONDUCTOR DEVICE WITH REDUCED SENSITIVITY TO PACKAGE STRESS

(75) Inventors: Andrew C. McNeil, Chandler, AZ (US); Aaron A. Geisberger, Phoenix, AZ (US); Daniel N. Koury, Jr., Mesa, AZ (US); Gary G. Li, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 776 days.

(21) Appl. No.: 12/130,702

(22) Filed: May 30, 2008

(65) Prior Publication Data

US 2009/0293617 A1    Dec. 3, 2009

(51) Int. Cl.
*G01P 15/125* (2006.01)
(52) U.S. Cl. .................. 73/514.32; 73/514.38
(58) Field of Classification Search ............... 73/514.32, 73/514.38
See application file for complete search history.

(56) References Cited

U.S. PATENT DOCUMENTS

| | | | |
|---|---|---|---|
| 5,994,161 | A | 11/1999 | Bitko et al. |
| 6,122,963 | A | 9/2000 | Hammond et al. |
| 6,936,492 | B2 | 8/2005 | McNeil et al. |
| 2005/0005698 | A1 | 1/2005 | McNeil et al. |
| 2007/0024156 | A1* | 2/2007 | Li et al. .................. 310/309 |

OTHER PUBLICATIONS

Mukherjee, T., et al.; Structured Design of Microelectromechanical Systems; 34th Design Automation Conference; 1997; IEEE.
Xiong, X., et al.; A Dual-Mode Built-in Self-Test Technique for Capacitive MEMS Devices; IEEE Transactions on Instrumentation and Measurement, vol. 54, No. 5., Oct. 2005, pp. 1739-1750; IEEE.
O'Brien, G., et al.; Angular Accelerometer with Dual Anchor Support; 12th International Conference on Solid State Sensors, Actuators and Microsystems, Boston, Jun. 8-12, 2003; IEEE.
PCT Application No. PCT/US2009/037266; Search Report and Written Opinion; mailed Jul. 31, 2009.

* cited by examiner

*Primary Examiner* — John Chapman, Jr.
(74) *Attorney, Agent, or Firm* — Meschkow & Gresham, P.L.C.

(57) ABSTRACT

A microelectromechanical systems (MEMS) sensor (52) includes a substrate (62) a movable element (58) spaced apart from the substrate (62), suspension anchors (66, 68, 70, 72) formed on the substrate (62), and compliant members (74) interconnecting the movable element (58) with the suspension anchors. The MEMS sensor (52) further includes fixed fingers (76) and fixed finger anchors (78) attaching the fixed fingers (76) to the substrate (62). The movable element (58) includes openings (64). At least one of the suspension anchors resides in at least one of the multiple openings (64) and pairs (94) of the fixed fingers (76) reside in other multiple openings (64). The MEMS sensor (52) is symmetrically formed, and a location of the fixed finger anchors (78) defines an anchor region (103) within which the suspension anchors (66, 68, 70, 72) are positioned.

9 Claims, 4 Drawing Sheets

PRIOR ART

SEMICONDUCTOR DEVICE WITH REDUCED SENSITIVITY TO PACKAGE STRESS

TECHNICAL FIELD OF THE INVENTION

The present invention relates generally to semiconductor devices. More specifically, the present invention relates to a microelectromechanical systems (MEMS) semiconductor device with reduced sensitivity to deformation caused by, for example, package stress.

BACKGROUND OF THE INVENTION

Microelectromechanical Systems (MEMS) sensors are widely used in applications such as automotive, inertial guidance systems, household appliances, protection systems for a variety of devices, and many other industrial, scientific, and engineering systems. Such MEMS sensors are used to sense a physical condition such as acceleration, pressure, or temperature, and to provide an electrical signal representative of the sensed physical condition. Capacitive-sensing MEMS designs are highly desirable for operation in high acceleration environments and in miniaturized devices, due to their relatively low cost.

FIG. 1 shows a top view of a prior art MEMS capacitive accelerometer 20 which is adapted to sense acceleration in an X direction 24 (that is, acceleration parallel to a major planar surface of the device). Accelerometer 20 includes a movable element 26, sometimes referred to as a proof mass or shuttle, suspended above an underlying substrate 28. Suspension anchors 30 are formed on substrate 28 and compliant members 32 interconnect movable element 26 with suspension anchors 30. Pairs of fixed fingers 34 are attached to substrate 28 by fixed finger anchors 36, and a sense finger 38 extending from movable element 26 is positioned adjacent to fixed fingers 34. Sense gaps 40 are thus formed between each side of sense fingers 38 and corresponding fixed fingers 34. In a structure of this type, when movable element 26 moves in response to acceleration in X direction 24, capacitances 42 and 44 between the moving sense fingers 38 and the fixed fingers 34 change. MEMS accelerometer 20 is provided with electronic circuitry (not shown) which converts these capacitive changes to signals representative of acceleration in X direction 24.

Many MEMS sensor applications require smaller size and low cost packaging to meet aggressive cost targets. In addition, MEMS sensor applications are calling for lower temperature coefficient of offset (TCO) specifications. TCO is a measure of how much thermal stresses effect the performance of a semiconductor device, such as a MEMS sensor. A high TCO indicates correspondingly high thermally induced stress, or a MEMS device that is very sensitive to such a stress. The packaging of MEMS sensor applications often uses materials with dissimilar coefficients of thermal expansion. Thus, an undesirably high TCO often develops during manufacture or operation. In addition, stresses can result from soldering the packaged semiconductor device onto a printed circuit board in an end application. These stresses can result in the deformation of the underlying substrate 28, referred to herein as package stress. For example, deformation of substrate 28 can result in displacements, represented by arrows 46, of suspension anchors 30 and fixed finger anchors 36. Displacements 46 induced by package stress cause changes in sense capacitances 42 and 44, thus adversely affecting capacitive accelerometer 20 output.

For the typical architecture of capacitive accelerometer 20, transducer output can be approximated by the difference between capacitance 42 and capacitance 44. Transducer output will not be affected in this architecture if displacements 46 cause both capacitances 42 and 44 to change by the same magnitude and direction. Thus, the output of MEMS sensor 20 may not be affected if the displacement of movable element 26 is substantially equivalent to the average displacement of fixed fingers 34 in the sense direction, i.e., X direction 24.

However, substrate 28 may undergo some non-linear displacement due to package stress. A component of the non-linear displacement may be non-linear displacement variation, or non-uniform stretching, across a surface of substrate 28 in X direction 24. This non-linear displacement variation is represented in FIG. 1 by dashed straight lines 48. Another component of the non-linear displacement may be non-linear in-plane deformation, or curvature, of substrate 28 in X direction 24. This in-plane "curvature" across the surface of substrate 28 is represented in FIG. 1 by dashed curved lines 50. In-plane curvature 50 represents the condition in which the top and bottom edges of capacitive accelerometer 20 are displaced by a similar amount in X direction 24, but the center region of capacitive accelerometer 20 is displaced by a different amount. Non-linear displacement variation 48 and in-plane curvature 50 result in the displacement of movable element 26 that is not substantially equivalent to the average displacement of fixed fingers 34 in the sense direction, i.e., X direction 24.

Packaging stresses can be reduced by coating the transducer die with an elastomer (sometimes referred to as a "dome coat"). However, such coatings complicate the manufacturing process and lead to an undesirably larger MEMS sensor. Furthermore, as the size of MEMS sensors decrease, a stress isolating dome coat cannot readily be used.

Thus, what is needed is a low cost, compact, single die transducer that can sense along one or more axes, that is less susceptible to thermally induced package stress gradients, and that does not require the use of a dome coat or other features designed to reduce packaging stress.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

In one aspect, a differential capacitive transducer includes a symmetrical arrangement of elements as well as the establishment of an anchor region defined by the location of fixed finger anchors. Suspension anchors for a movable element, or proof mass, are positioned within this anchor region. These features reduce the effects of package stress on transducer output by effectively canceling non-linear components of displacement. Thus, such a differential capacitive transducer is less susceptible to deformation caused by, for example, thermally induced package stress gradients, and can be readily implemented as a low cost, compact, single die transducer utilizing conventional manufacturing processes.

Figure 2:
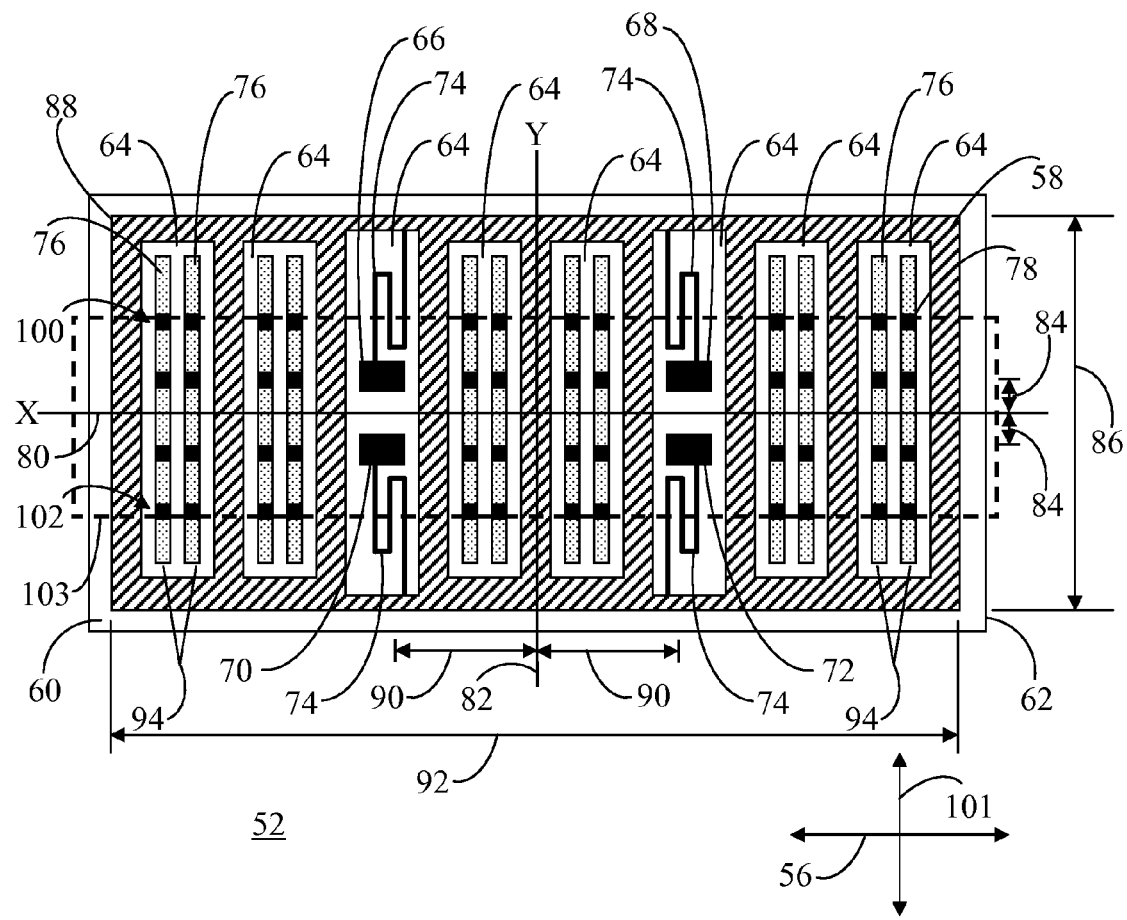
FIG. 2 shows a top view of a Microelectromechanical systems (MEMS) sensor in accordance with an embodiment of the invention.
Figure 3:
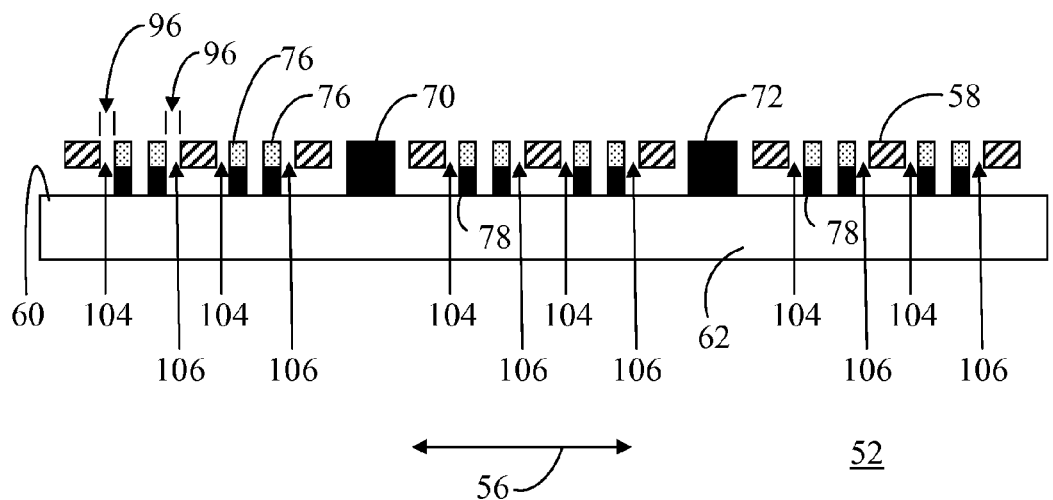
FIG. 3 shows a side view of the MEMS sensor of FIG. 2.

Referring to FIGS. 2-3, FIG. 2 shows a top view of a microelectromechanical systems (MEMS) sensor 52 in accordance with an embodiment of the invention, and FIG. 3 shows a side view of MEMS sensor 52. Sensor 52 may be, for example, an accelerometer or other MEMS sensing device. For purposes of the following discussion, MEMS sensor 52 is referred to hereinafter as capacitive transducer 52. Capacitive transducer 52 is a single axis accelerometer adapted to detect acceleration in an X direction 56. Capacitive transducer 52 provides significant capacitive output, while its structure greatly reduces the effect of package stress on transducer output.

Capacitive transducer 52 includes a movable element 58 in spaced apart relationship above a surface 60 of a substrate 62. Multiple openings 64 extend through movable element 58. Multiple suspension anchors 66, 68, 70, and 72 are formed on surface 60 of substrate 62. Multiple compliant members 74, also referred to as springs or flexures, interconnect movable element 58 with suspension anchors 66, 68, 70, and 72. Compliant members 74 enable motion of movable element 58 in X direction 56, in response to acceleration. In one embodiment, compliant members 74 exhibit an equivalent spring constant, k, indicating the stiffness of compliant members 74. That is, the force required to flex any of compliant members 74 is substantially the same for each of compliant members 74. Capacitive transducer 52 further includes fixed fingers 76 arranged in substantially parallel alignment relative to one another. Fixed fingers 76 are attached to surface 60 of substrate 62 via fixed finger anchors 78.

In order to clearly demarcate the various elements of capacitive transducer 52 in the figures, movable element 58 is represented by rightwardly and upwardly directed hatching. Suspension anchors 66, 68, 70, 72, and fixed finger anchors 78 are represented by solid block shading, and fixed fingers 76 are represented by stippling.

MEMS capacitive transducer 52 may be fabricated utilizing a number of known and upcoming MEMS fabrication processes including, for example, deposition, photolithography, etching, and so forth. In one example, a sacrificial layer (not shown) may be deposited on substrate 62. An active layer, such as a polysilicon, may then be deposited over the sacrificial layer as a blanket layer. The polysilicon active layer can then be patterned and etched to form the structures of capacitive transducer 52. Following patterning, the sacrificial layer is etched using known processes to release movable element 58 and compliant members 74 from the underlying substrate 62. Accordingly, although the elements of capacitive accelerometer, may be described variously as being "fixed to," "interconnected with," "coupled to," or "attached to" other elements of capacitive transducer 52, it should be readily apparent that the terms refer to the physical connection of particular elements of MEMS capacitive transducer 52 that occurs during their formation through the patterning and etching processes of MEMS fabrication. It should also be noted that movable element 58 and compliant members 74 may be fabricated with through-holes (not shown for simplicity of illustration) that provide a passage for an etch material that may be used to release movable element 58 and compliant members 74 from the underlying substrate 62.

Capacitive transducer 52 exhibits an X axis of symmetry 80 that is substantially parallel to X direction 56. In addition, capacitive transducer 52 exhibits a Y axis of symmetry 82 that is substantially parallel to a Y direction 101 and is thus substantially orthogonal to X axis of symmetry 80. Both X axis of symmetry 80 and Y axis of symmetry 82 are also parallel to the major planar surface of capacitive transducer 52. An axis of symmetry is a line in a geometric figure which divides the figure into two parts such that one part, when folded over along the axis of symmetry, coincides with the other part. Accordingly, capacitive transducer 52 exhibits an equivalent size and placement of its components on either side of X and Y axes of symmetry 80 and 82.

The symmetrical configuration of capacitive transducer 52 entails an equivalent quantity and size of multiple openings 64 on opposing sides of Y axis of symmetry 82. Additionally, multiple openings 64 are substantially parallel to Y axis of symmetry 82 and extend an equal distance on either side of X axis of symmetry 80.

In one embodiment, suspension anchors 66 and 70 reside in one of openings 64 extending through movable element 58, and suspension anchors 68 and 72 reside in another of openings 64 extending through movable element 58. Suspension anchors 66 and 68 are offset a distance 84 from X axis of symmetry 80. Likewise, suspension anchors 70 and 72 are offset distance 84 on an opposing side of X axis of symmetry 80. Distance 84 is less than one half of a width 86 of a sense region 88 of movable element 58. The term "sense region" refers to that portion of movable element 58 at which capacitance changes between fixed fingers 76 and movable element 58 are used to determine differential capacitance, responsive to the movement of movable element 58. Thus, distance 84 is greater than zero (i.e., greater than Y=0) but less than half of width 86 (i.e., less than Y=W/2).

In addition, suspension anchors 66 and 70 are offset a distance 90 from Y axis of symmetry 82. Likewise, suspension anchors 68 and 72 are offset distance 90 on an opposing side of Y axis of symmetry 80. Distance 90 is less than one half of a length 92 of sense region 88 of movable element 58. Thus, distance 90 is greater than zero (i.e., greater than X=0) but less than half of length 92 (i.e., less than X=L/2). Accordingly, suspension anchors 66, 68, 70, and 72 are positioned at intermediate and symmetric locations between a center of sense region 88 and an outer perimeter of sense region 88.

In one embodiment, pairs 94 of fixed fingers 76 reside in others of multiple openings 64. Pairs 94 of fixed fingers 76 on one side of Y axis of symmetry 82 are symmetrically arranged with corresponding pairs 94 of fixed fingers on the opposing side of Y axis of symmetry 82. However, like multiple openings 62, each of fixed fingers 76 is in parallel alignment with Y axis of symmetry 82 and each of fixed fingers 76 extends an equal distance on either side of X axis of symmetry 80. A sense gap 96 (see FIG. 3) is thus formed between each side of fixed fingers 76 and a closest inner peripheral wall of the one of multiple openings 64 in which it is located. A total of six pairs 94 of fixed fingers 76 are illustrated for simplicity of illustration. However, in alternative embodiments, capacitive transducer 52 may include more than or fewer than six pairs 94 of fixed fingers 76.

Multiple fixed finger anchors 78 may be coupled to each of fixed fingers 76 to attach fixed fingers 76 to the underlying substrate 62. In this exemplary embodiment, four of fixed finger anchors 78 are used to attach each of fixed fingers 76 to substrate 62. The four fixed finger anchors 78 are uniformly distributed along each of fixed fingers 76. In addition, the four fixed finger anchors 78 are symmetrically arranged relative to X axis of symmetry 80. Although four fixed finger anchors 78 are shown as attaching each of fixed fingers 76 to the underlying substrate 62, in alternative embodiments, less than or greater than four fixed finger anchors 78 may be utilized.

With continued reference to FIGS. 2 and 3, a portion 100 of fixed finger anchors 78 is substantially aligned relative to one another in X direction 56. Portion 100 of fixed finger anchors 78 is offset from X axis of symmetry 80 in a Y direction 101 that is orthogonal to X direction 56. Likewise, another portion 102 of fixed finger anchors 78 is substantially aligned relative to one another in X direction 56, and is offset from X axis of symmetry 80 in Y direction 101. In other words, portion 100 of fixed finger anchors 78 and portion 102 of fixed finger anchors 78 are placed on opposing sides of X axis of symmetry 80. The displacement of portions 100 and 102 of fixed fingers anchors 78 from X axis of symmetry 80 in Y direction 101 defines an anchor region 103 in which the location of portions 100 and 102 are upper and lower borders (in Y direction 101) within which all of suspension anchors 66, 68, 70, and 72 are positioned. It should be understood that the portions of fixed finger anchors 78 offset farthest away from X axis of symmetry 80 in Y direction 101 are utilized to define anchor region 103 regardless of the total quantity of fixed finger anchors 78 attaching each of fixed fingers 76 to substrate 62.

Compliant members 74 suspend movable element 58 over substrate 62 in a neutral position that is generally parallel to substrate 62. Compliant members 74 function to keep movable element 58 in the neutral position until the selective application of force or acceleration, due to some other means, causes a deflection thereof. Movement of movable element 58 deforms compliant members 74, storing potential energy therein. The stored potential energy tends to return movable element 58 to its neutral position once the force or acceleration is removed. By way of example, movable element 58 of MEMS capacitive transducer 52 moves in X direction 56 when transducer 52 experiences acceleration. When movable element 58 moves in response to acceleration in X direction 56, capacitances 104 and 106 change in sense gaps 96. Electronic circuitry (not shown) sums all of capacitances 104, and sums all of capacitances 106. The difference between capacitances 104 and 106 yields a differential capacitance, which is subsequently converted to signals representative of acceleration in X direction 56.

Figure 1:
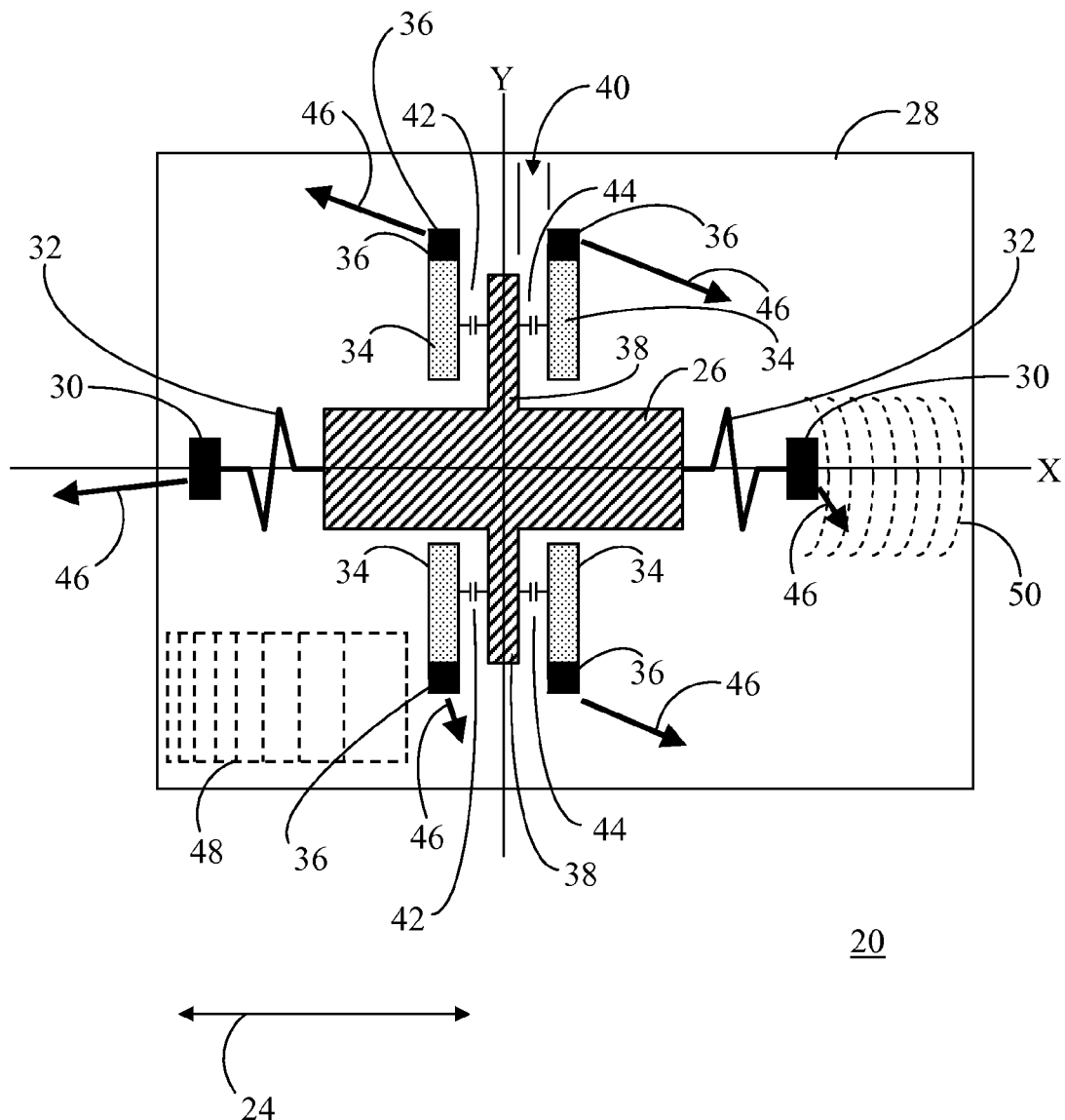
FIG. 1 shows a top view of a prior art capacitive accelerometer.

The symmetrical configuration of the elements within sense region 88, the displacement of suspension anchors 66, 68, 70, and 72 from X and Y axes of symmetry 80 and 82, and the positioning of suspension anchors 66, 68, 70, and 72 within anchor region 103 defined by the placement of portions 100 and 102 of fixed finger anchors 78 produces a scenario in which non-linear displacement 48 (FIG. 1) and in-plane curvature 50 (FIG. 1) are substantially canceled. Thus, the effect of package stress on transducer output is greatly reduced. In addition, the multiple openings 64 and placement of fixed fingers 76 within multiple openings 64 provides significant capacitive output of MEMS capacitive transducer 52.

Figure 4:
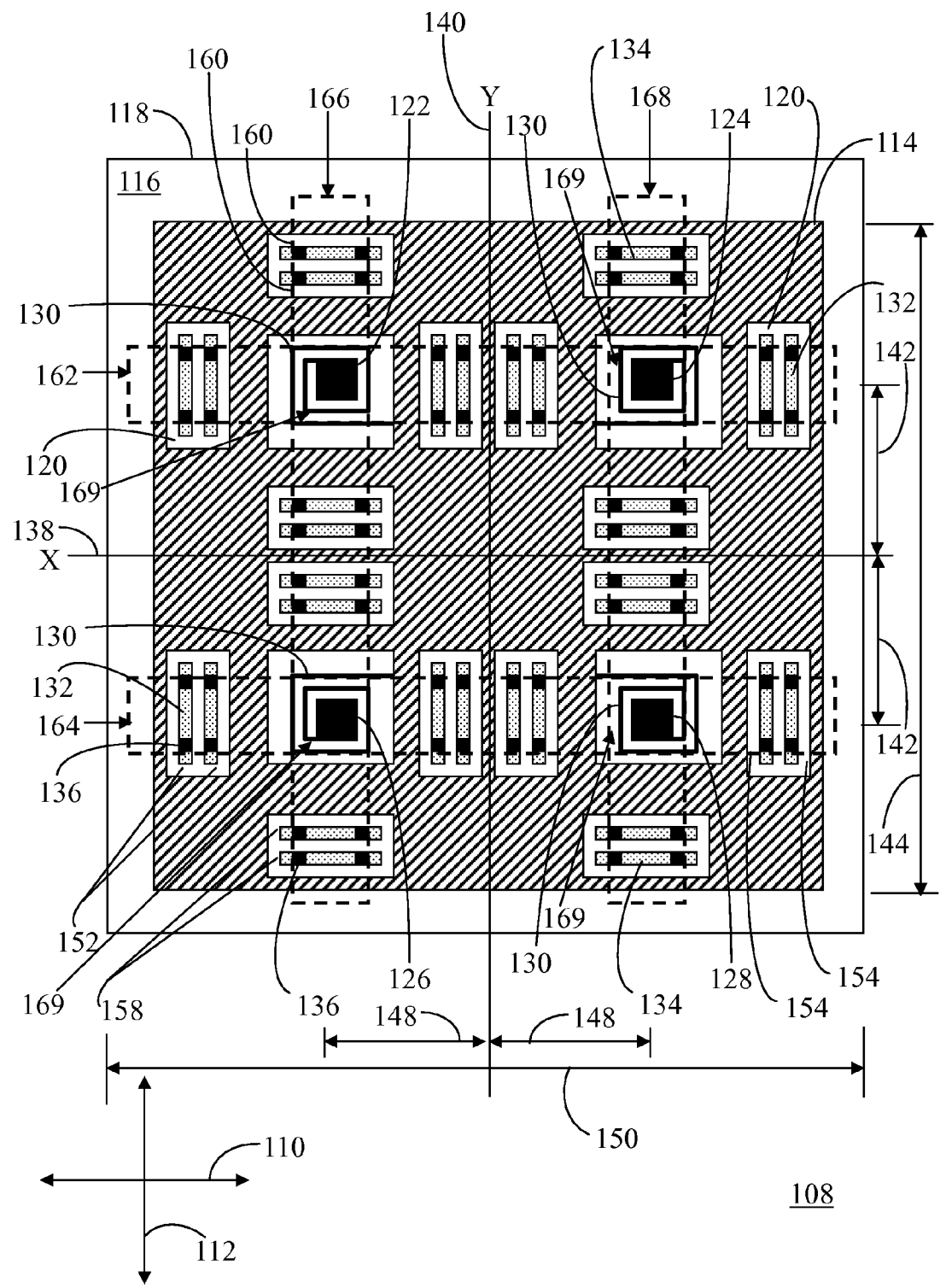
FIG. 4 shows a top view of a MEMS sensor in accordance with another embodiment of the invention.

FIG. 4 shows a top view of a MEMS sensor 108 in accordance with another embodiment of the invention. MEMS sensor 108 is a dual axis accelerometer adapted to detect acceleration in an X direction 110 and a Y direction 112 that is orthogonal to X direction 110. For purposes of the following discussion, MEMS sensor 108 is referred to hereinafter as dual axis capacitive transducer 108. Like capacitive transducer 52 (FIG. 2), dual axis capacitive transducer 108 provides significant capacitive output, while its structure greatly reduces the effect of package stress on accelerometer output. Although a dual-axis accelerometer configuration is described herein, it should be understood that the dual axis configuration of transducer 108 may additionally be utilized to sense acceleration in X direction 110 and Y direction 112 in a three axis accelerometer package.

Dual axis capacitive transducer 108 includes a movable element 114 in spaced apart relationship above a surface 116 of a substrate 118. Multiple openings 120 extend through movable element 114. Multiple suspension anchors 122, 124, 126, and 128 are formed on surface 116 of substrate 118. Multiple compliant members 130 interconnect movable element 114 with suspension anchors 122, 124, 126, and 128. Compliant members 130 enable motion of movable element 114 in both X direction 110 and Y direction 112 in response to acceleration. In one embodiment, compliant members 130 exhibit an equivalent spring constant, k.

Capacitive transducer 108 further includes a set of fixed fingers 132 arranged in substantially parallel alignment relative to one another. Another set of fixed fingers 134 is arranged in substantially parallel alignment relative to one another, but are orthogonal to fixed fingers 132. Fixed fingers 132 and 134 are attached to surface 116 of substrate 118 via fixed finger anchors 136.

In order to clearly demarcate the various elements of capacitive transducer 108 in FIG. 4, movable element 114 is represented by rightwardly and upwardly directed hatching. Suspension anchors 122, 124, 126, and 128, and fixed finger anchors 136 are represented by solid block shading, and fixed fingers 132 and 134 are represented by stippling.

Dual axis capacitive transducer 108 exhibits an X axis of symmetry 138 that is substantially parallel to X direction 110. In addition, dual axis capacitive transducer 108 exhibits a Y axis of symmetry 140 that is substantially parallel to Y direction 112 and is substantially orthogonal to X axis of symmetry 138. Accordingly, dual axis capacitive transducer 108 exhibits an equivalent size and placement of its components on either side of X and Y axes of symmetry 138 and 140, and the symmetrical configuration of capacitive transducer 108 entails an equivalent quantity and size of multiple openings 120 on opposing sides of X axis of symmetry 138 and on opposing sides of Y axis of symmetry 140.

In one embodiment, each of suspension anchors 122, 124, 126, and 128 reside in a distinct one of openings 120 extending through movable element 114. Suspension anchors 122 and 124 are offset a distance 142 from X axis of symmetry 138. Likewise, suspension anchors 126 and 128 are offset distance 142 on an opposing side of X axis of symmetry 138. Distance 142 is less than one half of a width 144 of a sense region 146 of movable element 114. Thus, distance 142 is greater than zero (i.e., greater than Y=0) but less than half of width 144 (i.e., less than Y=W/2). In addition, suspension anchors 122 and 126 are offset a distance 148 from Y axis of symmetry 140. Likewise, suspension anchors 124 and 128 are offset distance 148 on an opposing side of Y axis of symmetry 140. Distance 148 is less than one half of a length 150 of sense region 146 of movable element 114. Thus, distance 148 is greater than zero (i.e., X=0) but less than half of length 150 (i.e., X=L/2). Accordingly, suspension anchors 122, 124, 126, and 128 are positioned at intermediate and symmetric locations between a center of sense region 146 and an outer perimeter of sense region 146.

In one embodiment, pairs 152 of fixed fingers 132 reside in openings 120 and have longitudinal axes aligned parallel with Y axis of symmetry 140. Pairs 152 of fixed fingers 132 residing on one side of Y axis of symmetry 140 are symmetrically arranged with corresponding pairs 152 of fixed fingers 132 on the opposing side of Y axis of symmetry 140. In addition, pairs 152 of fixed fingers 132 are symmetrically arranged with corresponding pairs 152 of fixed fingers 132 on the opposing side of X axis of symmetry 138. A sense gap 154 is thus formed between each side of fixed fingers 132 and a closest inner peripheral wall of the one of multiple openings 120 in which it is located.

Pairs 158 of fixed fingers 134 also reside in distinct openings 120, but have longitudinal axes aligned parallel with X axis of symmetry 138. Pairs 158 of fixed fingers 134 residing on one side of X axis of symmetry 138 are symmetrically arranged with corresponding pairs 154 of fixed fingers 134 on the opposing side of X axis of symmetry 138. In addition, pairs 158 of fixed fingers 134 are symmetrically arranged with corresponding pairs 158 of fixed fingers 134 on the opposing side of Y axis of symmetry 140. A sense gap 160 is thus formed between each side of fixed fingers 134 and a closest inner peripheral wall of the one of multiple openings 120 in which it is located.

In one embodiment, two fixed finger anchors 136 are coupled to each of fixed fingers 132 and 134 to attach fixed fingers 132 and 134 to the underlying substrate 118. With continued reference to FIG. 4, an anchor region 162 is defined by the two fixed finger anchors 136 attaching each pair 152 of fixed fingers 132 aligned in X direction 110. In addition, another anchor region 164 is defined by the two fixed fingers anchors 136 attaching each pair 152 of fixed fingers 32 aligned in X direction 110. Anchor regions 162 and 164 are offset in Y direction 112 on opposing sides of X axis of symmetry 138. An anchor region 166 is defined by the two fixed finger anchors 136 attaching each pair 158 of fixed fingers 134 aligned in Y direction 112 and an anchor region 168 is defined by the two fixed finger anchors 136 attaching each pair 158 of fixed fingers 134 aligned in Y direction 112. Anchor regions 166 and 168 are offset in X direction 110 on opposing sides of Y axis of symmetry. Anchor regions 166 and 168 overlap anchor region 162 to form overlapping regions 169. Likewise, anchor regions 166 and 168 overlap anchor region 164 to form additional overlapping anchor regions 169. In an embodiment, one each of suspension anchors 122, 124, 126, and 128 is positioned within each of overlapping regions 169.

Compliant members 130 enable movement of movable element 114 in X direction 110 and Y direction 112 when dual axis transducer 108 experiences acceleration in those directions. When movable element 114 moves in response to acceleration in X direction 110, capacitances change in sense gaps 154. Electronic circuitry (not shown) determines a differential capacitance, which is subsequently converted to signals representative of acceleration of dual axis transducer 108 in X direction 110. When movable element 114 moves in response to acceleration in Y direction 112, capacitances change in sense gaps 160. The electronic circuitry determines a differential capacitance which is subsequently converted to signals representative of acceleration of dual axis transducer 108 in Y direction 112.

The symmetrical configuration of the elements within sense region 146, the displacement of suspension anchors 122, 124, 126, and 128 from X and Y axes of symmetry 138 and 140, and the positioning of suspension anchors 122, 124, 126, and 128 within overlapping anchor regions 169 defined by the placement of fixed finger anchors 136 produces a scenario in which non-linear displacement 48 (FIG. 1) and in-plane curvature 50 (FIG. 1) are substantially canceled. Thus, the effect of package stress on transducer output is greatly reduced in dual axis capacitive transducer 108. In addition, the multiple openings 120 and placement of fixed fingers 132 and 134 within multiple openings 120 provides significant capacitive output of MEMS dual axis capacitive transducer 108.

As mentioned above in connection with capacitive transducer 52 (FIG. 2), it should be understood that in alternative embodiments more or fewer than two fixed finger anchors 136 may be employed. Additionally, in alternative embodiments, dual axis capacitive transducer 108 may include more or fewer than the quantity of pairs 152 of fixed fingers 132 and pairs 158 of fixed fingers 134 shown herein.

Figure 5:
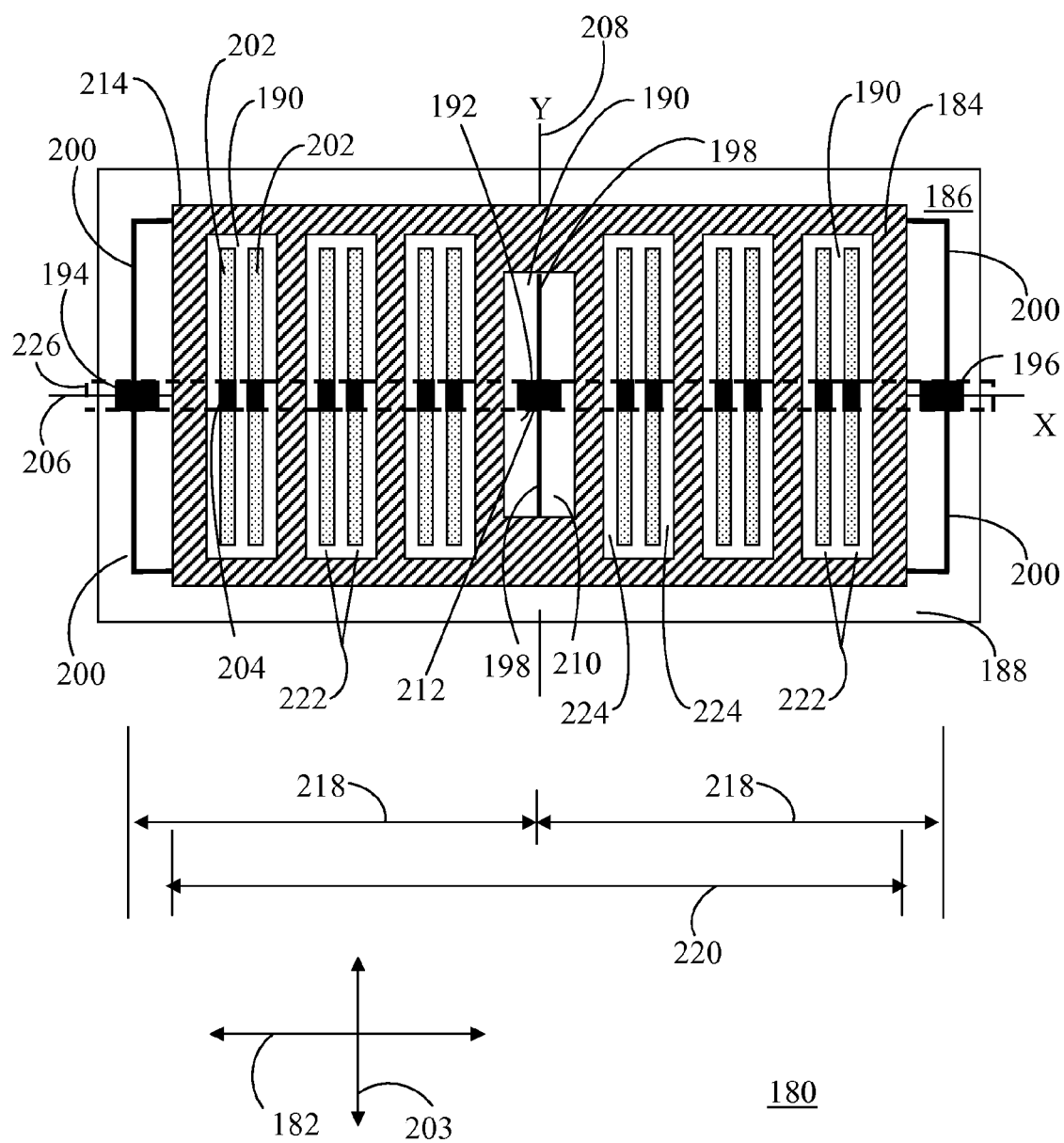
FIG. 5 shows a top view of a MEMS sensor in accordance with another embodiment of the invention.

FIG. 5 shows a top view of a MEMS sensor 180 in accordance with another embodiment of the invention. MEMS sensor 180 is a single axis accelerometer adapted to detect acceleration in an X direction 182. As such, MEMS sensor 180 is referred to hereinafter as capacitive transducer 180. Like capacitive transducers 52 (FIG. 2) and 108 (FIG. 3), capacitive transducer 180 provides significant capacitive output, while its structure greatly reduces the effect of package stress on accelerometer output.

Capacitive transducer 180 includes a movable element 184 in spaced apart relationship above a surface 186 of a substrate 188. Multiple openings 190 extend through movable element 184, and multiple suspension anchors 192, 194, 196 are formed on surface 186 of substrate 188. A pair of compliant members 198 interconnect movable element 184 with suspension anchor 192, and a pair of compliant members 200 interconnect movable element 184 with each of suspension anchors 194 and 196. Compliant members 198 and 200 enable motion of movable element 184 in X direction 182, in response to acceleration detected by capacitive transducer 180. Capacitive transducer 180 further includes fixed fingers 202 arranged in substantially parallel alignment relative to one another. Fixed fingers 202 are attached to surface 186 of substrate 188 via fixed finger anchors 204.

In order to clearly demarcate the various elements of capacitive transducer 180 in FIG. 5, movable element 184 is represented by rightwardly and upwardly directed hatching. Suspension anchors 192, 194, 196, and fixed finger anchors 204 are represented by solid block shading, and fixed fingers 202 are represented by stippling.

Capacitive transducer 180 exhibits an X axis of symmetry 206 that is substantially parallel to X direction 182. In addition, capacitive transducer 180 exhibits a Y axis of symmetry 208 that is substantially parallel to a Y direction 203 and orthogonal to X axis of symmetry 206. Accordingly, capacitive transducer 180 exhibits an equivalent size and placement of its components on either side of X and Y axes of symmetry 206 and 208.

The symmetrical configuration of capacitive transducer 180 entails an equivalent quantity and size of multiple openings 190 on opposing sides of Y axis of symmetry 208. Additionally, multiple openings 190 are substantially parallel to Y axis of symmetry 208 and extend an equal distance on either side of X axis of symmetry 206.

One of multiple openings 190 is a central opening 210 positioned symmetrically relative to a center 212 of a sense region 214 of movable element 184. In this exemplary embodiment, suspension anchor 192 resides in central opening 210 of movable element 184 at center 212. Compliant members 198 are substantially straight beams that are affixed at opposing sides of suspension anchor. As such, respective longitudinal axes of compliant members 198 form a common axis through movable element 188 at Y axis of symmetry 208. In alternative embodiments, however, compliant members 198 may be formed into more complex shapes.

In contrast, suspension anchors 194 and 196 reside outside of sense region 214 of movable element 184. That is, in this embodiment, suspension anchors 194 and 196 are externally located relative to movable element 184. Suspension anchor 194 is offset a distance 218 from Y axis of symmetry 208.

Likewise, suspension anchor 196 is offset distance 218 from Y axis of symmetry 208. Distance 218 is greater than or substantially equal to one half of a length 220 of sense region 214.

Pairs 222 of fixed fingers 202 reside in multiple openings 190, excluding central opening 210. Pairs 222 of fixed fingers 202 on one side of Y axis of symmetry 198 are symmetrically arranged with corresponding pairs 222 of fixed fingers 202 on the opposing side of Y axis of symmetry 198. Each of fixed fingers 202 is in parallel alignment with Y axis of symmetry 208, and each of fixed fingers 202 extends an equal distance on either side of X axis of symmetry 206. A sense gap 224 is thus formed between each side of fixed fingers 202 and a closest inner peripheral wall of the one of multiple openings 190 in which it is located. Fixed fingers 202 may move in response to acceleration, force, and the like. However, their "movement" is negligible as compared to the movement of movable element 184 in response to the same acceleration, force, and the like.

In this embodiment, one each of fixed finger anchors 204 is used to attach one each of fixed fingers 202 to substrate 188. These fixed finger anchors 204 are positioned on X axis of symmetry 206 (i.e., at Y=0). Thus, the location of fixed finger anchors 204 on X axis of symmetry 206 defines an anchor region 226 centered on X axis of symmetry 206. Consequently, suspension anchors 192, 194, and 196 are positioned within anchor region 226 and are substantially aligned on X axis of symmetry 206 in X direction 182 (i.e., at Y=0).

In one embodiment, compliant members 198 may exhibit an equivalent spring constant, $k_1$, indicating the stiffness of compliant members 198. In addition, compliant members 200 exhibit an equivalent spring constant, $k_2$, indicating the stiffness of compliant members 200. However, the spring constant, $k_2$, of compliant members 200 is less than the spring constant, $k_1$, of compliant members 198. Thus, compliant members 198 are stiffer than compliant members 200. In one embodiment, compliant members 198 may be approximately four times stiffer than compliant members 200.

Compliant members 198 and 200 enable movement of movable element 184 in X direction 182 when capacitive transducer 180 experiences acceleration in X direction 182. When movable element 184 moves in response to acceleration in X direction 182, capacitances change in sense gaps 224. Electronic circuitry (not shown) processes the capacitances as discussed previously to yield a differential capacitance, which is subsequently converted to signals representative of acceleration of capacitive transducer 180 in X direction 182.

The symmetrical configuration of the elements within sense region 214 produces a scenario in which non-linear displacement variation 48 (FIG. 1) is substantially canceled in the capacitive transducer 180 design. In addition, the placement of suspension anchors 192, 194, and 196 within anchor region 226 centered on X axis of symmetry 206 produces a scenario in which in-plane curvature 50 (FIG. 1) is substantially canceled in the capacitive transducer 180 design. Thus, the combination of symmetrical configuration of the elements within sense region 214 and placement of suspension anchors 192, 194, and 196 within anchor region 226 centered on X axis of symmetry 206 produces a scenario in which both non-linear displacement variation 48 (FIG. 1) and in-plane curvature 50 (FIG. 1) are substantially canceled. Thus, the effect of package stress is greatly reduced on accelerometer output. In addition, the multiple openings 190 and placement of fixed fingers 202 within multiple openings 190 provides significant capacitive output of capacitive sensor 180. Moreover, from a manufacturing perspective, electrical interconnections may be more readily established than the other embodiments described above.

In general, the techniques described above entail the positioning of the suspension anchors within an anchor region defined by a location of the outermost fixed finger anchors (displaced in a Y direction). These locations define borders (in a Y direction) for a single axis transducer configuration, and borders (in both an X and a Y direction) for a dual axis transducer configuration in which suspension anchors are to be positioned. In the single axis configuration, as the anchor region becomes narrower, (i.e., less wide in the Y direction), the suspension anchors on opposing sides of the X axis of symmetry will move closer together until they merge on the X axis of symmetry, as shown in FIG. 5. Accordingly, those skilled in the art will recognize that the features described herein can be merged to arrive at various other embodiments of the capacitive sensor to reduce its sensitivity to package stress. For example, some of suspension anchors 66, 68, 70, and 72 and fixed finger anchors 76 of FIG. 2 could be moved to the centerline in the Y direction, as shown in FIG. 5, while remaining at their respective locations in the X direction.

Each of the embodiments described herein comprise a MEMS sensor in the form of a differential capacitive transducer. The embodiments includes a symmetrical arrangement of elements as well as the establishment of an anchor region defined by the location of fixed finger anchors. The suspension anchors for the movable element are positioned within this anchor region. These features reduce the effects of package stress on transducer output by effectively canceling non-linear components of displacement. Thus, such a differential capacitive transducer is less susceptible to thermally induced package stress gradients, and can be readily implemented as a low cost, compact, single die transducer utilizing conventional manufacturing processes. Moreover, the MEMS sensors do not require the use of a dome cost or other features designed to reduce packaging stress.

Although the preferred embodiments of the invention have been illustrated and described in detail, it will be readily apparent to those skilled in the art that various modifications may be made therein without departing from the spirit of the invention or from the scope of the appended claims. For example, MEMS sensor may be adapted to include a different number of anchors and/or a different number of spring members then that which is shown. In addition, the movable element can take on various other shapes and sizes then that which is shown.

What is claimed is:

1. A microelectromechanical systems (MEMS) sensor comprising:
   a substrate;
   a movable element positioned in spaced apart relationship above a surface of said substrate, said movable element having multiple openings extending through said movable element;
   multiple suspension anchors formed on said surface of said substrate;
   multiple compliant members interconnecting said movable element with said multiple suspension anchors, said multiple compliant members enabling motion of said movable element in a first direction and a second direction, said second direction being orthogonal to said first direction;
   first fixed fingers arranged in substantially parallel alignment, pairs of said first fixed fingers residing in a portion of said multiple openings, said first fixed fingers being adapted to detect said motion of said movable element in said first direction;

first fixed finger anchors formed on said surface of said substrate, at least one of said first fixed finger anchors being coupled to each of said first fixed fingers to attach said first fixed fingers to said substrate, a location of said first fixed finger anchors in said second direction defining a first anchor region, and said multiple suspension anchors being positioned within said first anchor region;

second fixed fingers arranged in substantially parallel alignment, said second fixed fingers being arranged orthogonal to said first fixed fingers, pairs of said second fixed fingers residing in a second portion of said multiple openings of said movable element, said second fixed fingers being adapted to detect said motion of said movable element in said second direction; and second fixed finger anchors formed on said surface of said substrate, at least one of said second fixed finger anchors being coupled to each of said second fixed fingers to fix said second fixed fingers to said substrate, a second location of said second fixed finger anchors in said first direction defining a second anchor region, said first and second anchor regions overlapping to form an overlapping anchor region, one of said multiple suspension anchors being positioned within said overlapping anchor region.

2. A microelectromechanical systems (MEMS) sensor comprising:
a substrate;
a movable element positioned in spaced apart relationship above a surface of said substrate, said movable element having multiple openings extending through said movable element, wherein a first one of said multiple openings is a central opening positioned symmetrically relative to a center of a sense region of said movable element;
a suspension anchor formed on said surface of said substrate, said suspension anchor residing in said central opening at said center
a compliant member interconnecting said movable element with said suspension anchor, said compliant member enabling motion of said movable element in a first direction;
fixed fingers arranged in substantially parallel alignment, pairs of said fixed fingers residing in a portion of said multiple openings, said fixed fingers being adapted to detect said motion of said movable element in said first direction; and
fixed finger anchors formed on said surface of said substrate, at least one of said fixed finger anchors being coupled to each of said fixed fingers to attach said fixed fingers to said substrate, a location of said fixed finger anchors in a second direction orthogonal to said first direction defining an anchor region, and said suspension anchor being positioned within said anchor region.

3. A MEMS sensor as claimed in claim 2 wherein said compliant member is a first compliant member, and said MEMS sensor further comprises a second compliant member, said first and second compliant members being affixed at opposing sides of said suspension anchor such that respective longitudinal axes of said first and second compliant members form a common axis through said movable element.

4. A MEMS sensor as claimed in claim 2 wherein said suspension anchor is a first suspension anchor, said compliant member is a first compliant member, and said MEMS sensor further comprises:
a second suspension anchor formed on said surface of said substrate and residing outside of a sense region of said movable element;
a second compliant member interconnecting said movable element with said second suspension anchor;
a third suspension anchor formed on said surface of said substrate and residing outside of said sense region of said movable element; and
a third compliant member interconnecting said movable element with said third suspension anchor, said second and third suspension anchors being positioned within said anchor region.

5. A MEMS sensor as claimed in claim 4 wherein said movable element exhibits an axis of symmetry parallel to said first direction, said first, second, and third suspension anchors and said fixed finger anchors being substantially aligned on said axis of symmetry.

6. A MEMS sensor as claimed in claim 4 wherein:
said first compliant member exhibits a first spring constant; and
each of said second and third compliant members exhibits a second spring constant that is less then said first spring constant.

7. A microelectromechanical systems (MEMS) sensor comprising:
a substrate;
a movable element positioned in spaced apart relationship above a surface of said substrate, said movable element having multiple openings extending through said movable element, said multiple openings including a central opening positioned symmetrically relative to a center of a sense region of said movable element, and said movable element exhibiting an axis of symmetry parallel to said first direction;
multiple suspension anchors formed on said surface of said substrate, said multiple suspension anchors including a first suspension anchor residing in said central opening at said center;
multiple compliant members interconnecting said movable element with said multiple suspension anchors, said multiple compliant members enabling motion of said movable element in a first direction;
fixed fingers arranged in substantially parallel alignment, pairs of said fixed fingers residing in a portion said multiple openings, said fixed fingers being adapted to detect said motion of said movable element in said first direction; and
fixed finger anchors formed on said surface of said substrate at said axis of symmetry, at least one of said fixed finger anchors being coupled to each of said fixed fingers to attach said fixed fingers to said substrate, a location of said fixed finger anchors in a second direction orthogonal to said first direction defining an anchor region, and said multiple suspension anchors being positioned within said anchor region.

8. A MEMS sensor as claimed in claim 7 wherein said multiple suspension anchors comprise second and third suspension anchors formed on said surface of said substrate and residing outside of a sense region of said movable element.

9. A MEMS sensor as claimed in claim 8 wherein said multiple compliant members comprise:
a pair of said compliant members, each of said pair of said compliant members being affixed at opposing sides of said first suspension anchor such that longitudinal axes of said each compliant member form a common axis through said movable element, said each compliant member exhibiting a first spring constant; and
others of said multiple compliant members interconnecting said movable element with respective ones of said second and third suspension anchors, said second and third suspension anchors, each of said others of said multiple compliant members exhibiting a second spring constant that is less than said first spring constant.

* * * * *